United States Patent
Mok et al.

(10) Patent No.: US 7,128,135 B2
(45) Date of Patent: Oct. 31, 2006

(54) COOLING DEVICE USING MULTIPLE FANS AND HEAT SINKS

(75) Inventors: Lawrence S. Mok, Brewster, NY (US); Pablo D. Quinones, Ann Arbor, MI (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/988,215

(22) Filed: Nov. 12, 2004

(65) Prior Publication Data

US 2006/0102324 A1 May 18, 2006

(51) Int. Cl.
*H05K 7/20* (2006.01)

(52) U.S. Cl. .......................... 165/104.26; 165/104.33; 165/125; 361/700

(58) Field of Classification Search ...................... None
See application file for complete search history.

(56) References Cited

U.S. PATENT DOCUMENTS

| | | | | |
|---|---|---|---|---|
| 5,638,895 A * | 6/1997 | Dodson | ....................... | 165/121 |
| 5,953,209 A * | 9/1999 | Chiu | ............................ | 361/697 |
| 6,712,129 B1 * | 3/2004 | Lee | ......................... | 165/104.21 |
| 6,745,824 B1 * | 6/2004 | Lee et al. | ............... | 165/104.14 |
| 6,785,140 B1 * | 8/2004 | Artman et al. | ............... | 361/709 |
| 6,795,316 B1 * | 9/2004 | Owens et al. | ................ | 361/704 |
| 6,804,115 B1 * | 10/2004 | Lai | ............................ | 361/695 |
| 6,892,800 B1 * | 5/2005 | Mok | ...................... | 165/104.33 |
| 6,920,045 B1 * | 7/2005 | Huang et al. | ................ | 361/700 |
| 6,945,318 B1 * | 9/2005 | Ma et al. | ................ | 165/104.33 |
| 2003/0039096 A1 * | 2/2003 | Sheu | ........................... | 361/687 |
| 2005/0087329 A1 * | 4/2005 | Zhang et al. | ........... | 165/104.33 |
| 2006/0032616 A1 * | 2/2006 | Yang | ...................... | 165/104.33 |
| 2006/0039117 A1 * | 2/2006 | Lee et al. | .................... | 361/719 |

* cited by examiner

*Primary Examiner*—Allen J. Flanigan
(74) *Attorney, Agent, or Firm*—Daniel P Morris

(57) ABSTRACT

The present invention is directed to a method of constructing a semiconductor chip cooling device consists of multiple fans and heat sinks to provide redundant cooling capability. Heat coming from a semiconductor chip is first distributed to several heat sinks using multiple heat pipes. The heat sinks are placed around the fan outlet such that air is pulled in near the center of the fan and then pushed to across the heat sinks. Multiple fans and heat sinks are stacked up to form a complete cooling device. An external control circuitry is used to monitor and control the fans. In case of one fan fails, the other fans will be speeded up to make up the lost of air flow.

18 Claims, 7 Drawing Sheets

COOLING DEVICE USING MULTIPLE FANS AND HEAT SINKS

FIELD OF THE INVENTION

The invention is directed to improve the capability and reliability of a cooling device for semiconductor chips. The invention is in the field of heat transfer and cooling of semiconductor chips used in the computer and telecommunication equipment.

BACKGROUND AND RELATION TO THE PRIOR ART

The problem to be solved by this invention is to provide an improved cooling device to a semiconductor chip using multiple fans and heat sinks. This cooling device has multiple fans connected in a redundant mode such that if one fan malfunctions, the remaining fans will spin up to make up the lost of air flows to the heat sinks. The current fan-heatsink uses only one fan and has no redundant feature.

(1) U.S. Pat. No. 5,309,983—"Low Profile Integrated Heat Sink and Fan Assembly", describes a heat sink with straight fins and a fan integrated in a cavity in the fin area. The base of the heat sink is a flat, solid plate and the fins are straight fins. The fan has air inlets on the top surface of the fan. Air is moving through the fan and the spacing between fins at two opposite directions. The solid heat sink base does not provide a compliant interface to the heated surface underneath and the air flows are restricted to own two directions which are inherently inefficiency. Furthermore, the air inlets are on one surface only.

(2) U.S. Pat. No. 5,502,619—"Heat Sink Assembly for Computer Chips", teaches another type of fan-heatsink assembly which has the fins stacked up by a plurality of sheets with openings and the fan placed on the top of the stacked sheets. This stacking method of making the fins for the heat sink will impede the heat flow from the heated source underneath the heat sink and hence rendering it inefficient for heat transfer. This heat sink has a solid base and the fan has inlets at the top surface only.

(3) U.S. Pat. No. 5,584,339—"Heat Sink Assembly for the Central Processor of Computer", describes another type of fan-heatsink assembly which has a fan with cover placed in the middle of the heat sink that has post-like fins. The post-like fins will give air multiple air flow paths with the heat sink but the fan still has one inlet on one surface. The base of the heat sink is also a solid plate.

(4) U.S. Pat. No. 5,785,116—"Fan Assisted Heat sink Device", teaches a heat sink assembly having heat sink housing surrounding the fan. Cold air enters the heat sink house near the top of the house and hot air exits the house from the bottom end in all the directions. Since there is no provision to separate the cold and hot air, air mixing may happen and the efficiency of the cooling device will degrade. Furthermore, the base of the heat sink is a solid plate which cannot provide compliant interface to the hot surface underneath. The hot air coming out from the heat sink device will add heating effects to the surrounding chips. This is considered undesirable.

SUMMARY OF THE INVENTION

The cooling device consists of multiple stacks of fan-heatsink sets, each of these sets has one centrifugal fan surrounded by heat sinking fins, and multiple heat pipes connecting the heatsinking fins to one heat distribution block. The heat distribution block is to be placed on top of an semiconductor chip. The heat distribution block has a few heat pipes inserted in for improving heat transfer within the block. Furthermore, the block can be made from a vapor chamber type in which liquid evaporation and condensation within the chamber is used to transfer heat from one surface of the block to the heat pipes inserted in the chamber.

DESCRIPTION OF THE INVENTION

Figure 1:
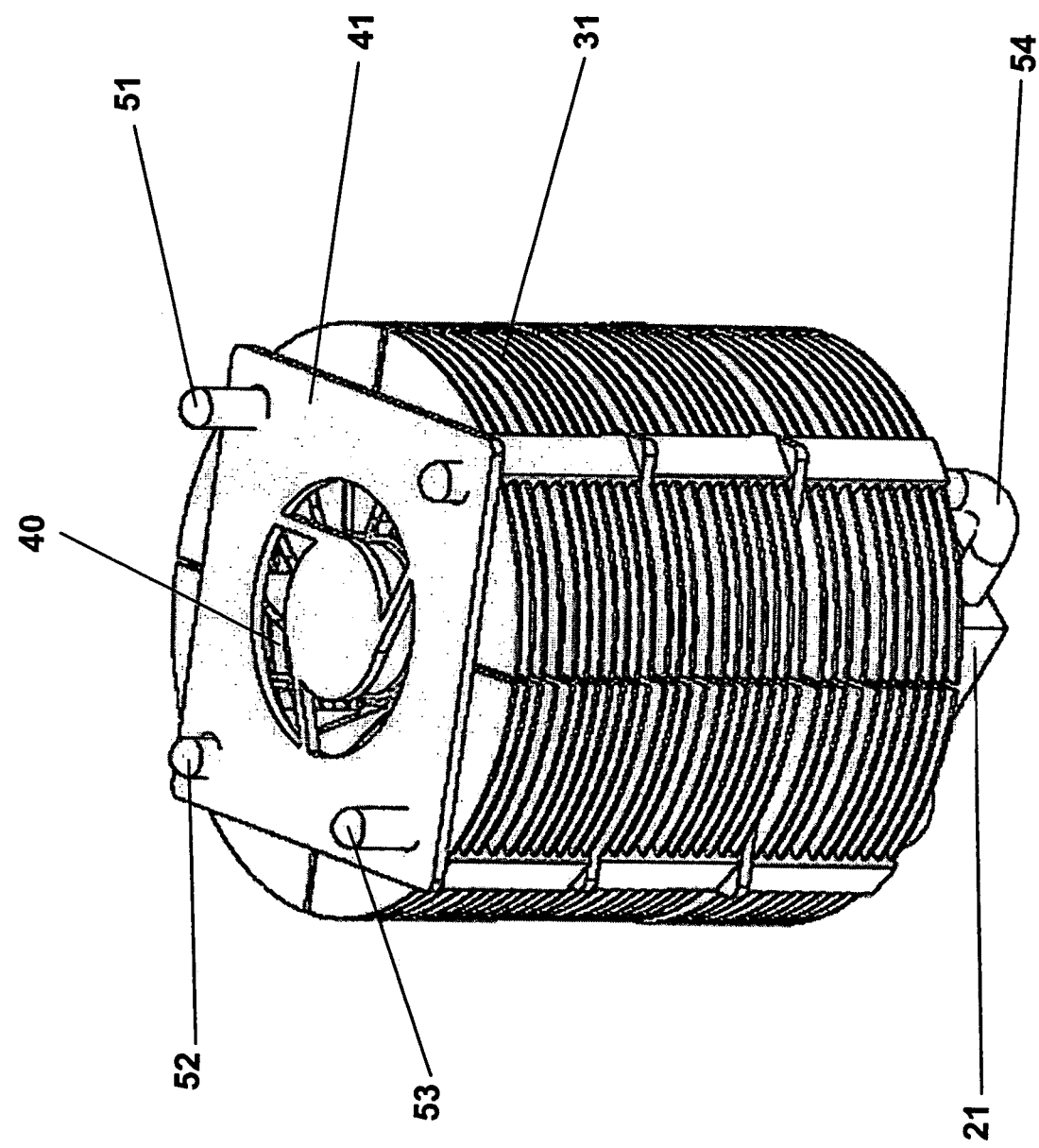
FIG. 1 The 3-D view of the multiple fan heatsinks with heat pipes and fans.
Figure 2:
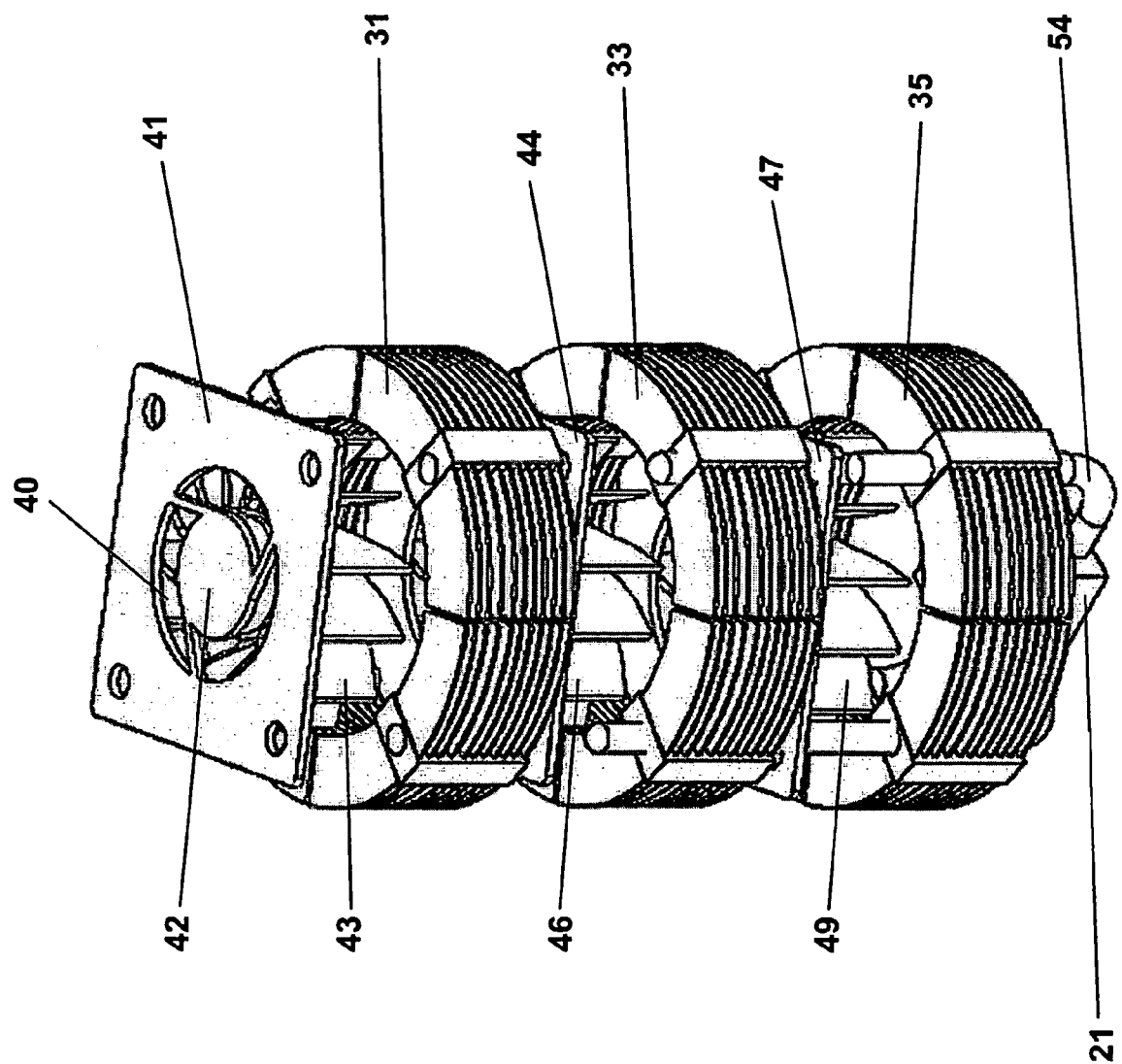
FIG. 2 The exploded view of the multiple fan heatsinks.

The detailed structure of this cooling device using multiple fan and heat sinks is shown in the following figures. FIG. 1 shows the fans 41 placed at the center surrounded by the heat sinking fins 31. The fins 31 can be arranged in line or in staggered faction which is not shown in the picture. The fins 31 are thermally connected to four heat pipes 51, 52, 53, and 54 respectively. All of the four heat pipes are then connected to a heat distribution block 21. FIG. 2 is the exploded view of the multiple fan heat sink. There are three sets of fan and fins in this figure. However, the number of the fan-fin sets can be any and should not be limited to just three. Each fan has its own motor and blades. Each fan can be run and controlled independently. The fans 41, 44, and 47 in the figure have their respective blades 43, 46, and 49. Only fan 41 has motor 42 shown for the clarity of the drawing. The fans 41, 44, and 47 are surrounded by the fin sets 31, 33, and 35, respectively. Four heat pipes 51, 52, 53, and 54 are used to transfer heat from the heat distribution block 21 to their respective fin sets 31, 33, and 35. The heat distribution block is brought into a good thermal contact with a heat generating semiconductor chip. Heat from the semiconductor chip will, therefore, transfer to the heat distribution block, the multiple heat pips, the fin sets, and the moving air passing through the fins. Air will be pulled into the fan at the inlet near the fan motor, for instance, air comes in from the inlet 40 of the fan 41. Similarly, air will come in from the inlet from the bottom fan 47. Part of the air coming in from fans 41 and 47 will pass through the fans and go to the inlet of the fan 44. All of the inlet air is then being pushed out to the fin sets by the centrifugal forces from the rotating blades 43, 46, and 49. The direction of the rotating blades of each fan can be the same or different.

Figure 3:
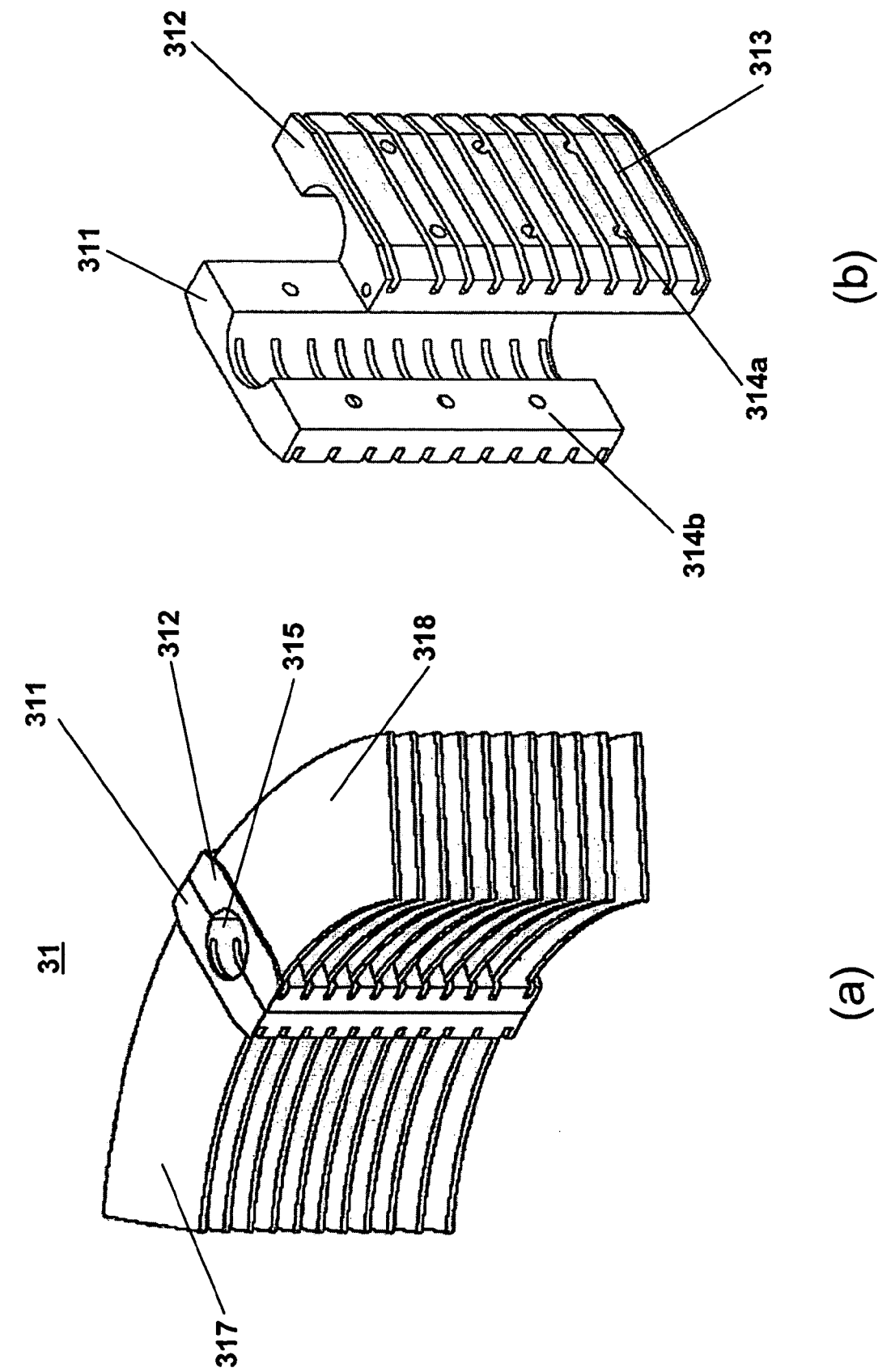
FIG. 3 The structure of the fins for the multiple fan heatsinks.

FIG. 3 shows the structure of one portion of the fin sets. FIG. 3a shows one assembled fin set which consists of multiple fins 317 and 318 inserted and soldered into the fin bases 311 and 312.

The fins and fin bases are made of heat conductive materials such as aluminum or copper.

Figure 4:
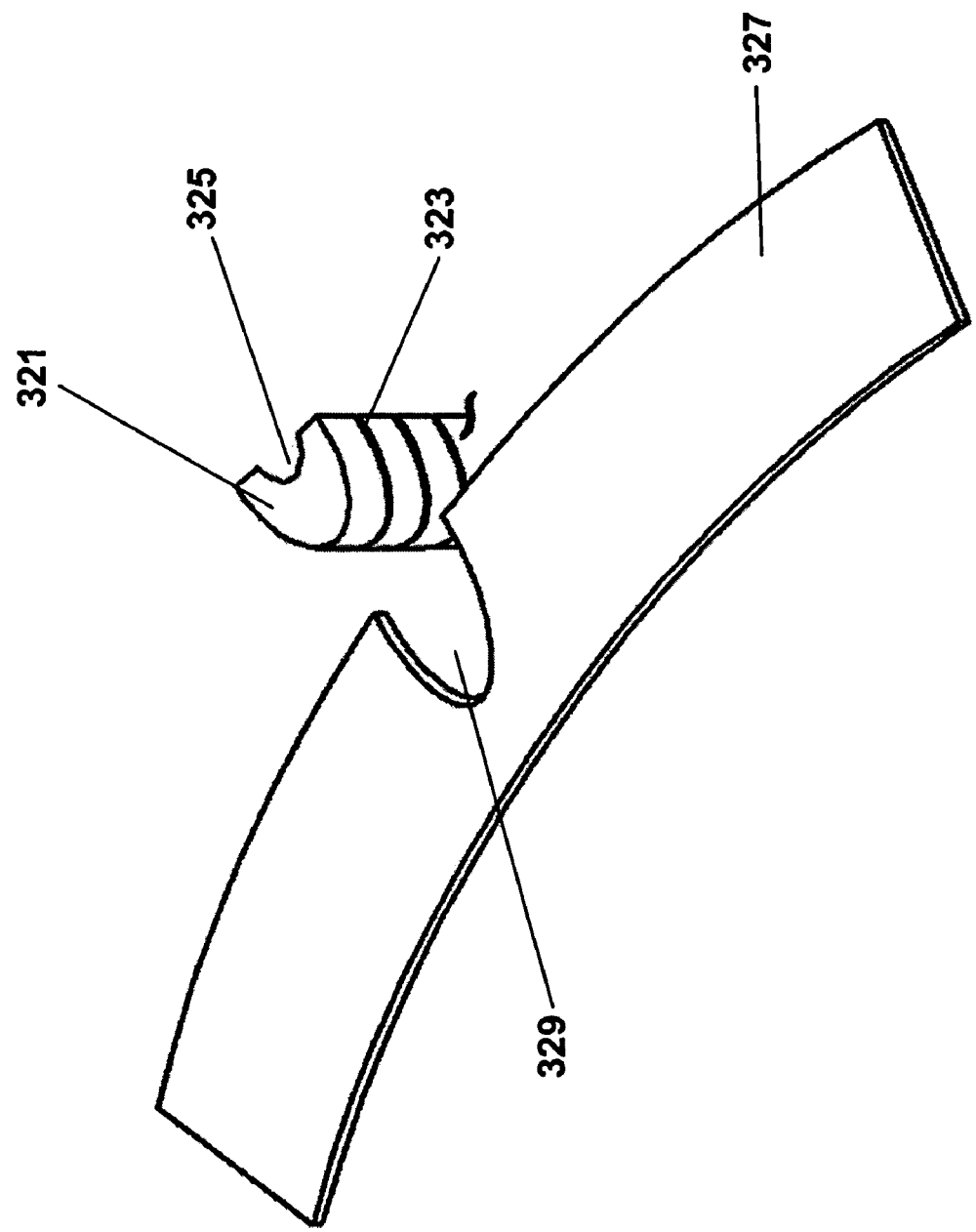
FIG. 4 Another embodiment of the fin structure.

FIG. 3b shows the details of the fin bases 311 and 312 before attaching the fins. Each fin base has slots 313 where the fins are to be inserted and soldered in. There are screw holes 314a and 314b on the fin bases. Two of the fin bases will be screwed together back to back with a heat pipe inside the hole 315. The heat pipe in the hole 315 is slightly compressed to provide a good thermal contact between the heat pipe and the fin base. Alternatively, the fin bases can be soldered on the heat pipe directly. FIG. 4 shows another embodiment of the fin sets. In this case, the fin base 321 looks like a half cylinder with horizontal slots 323 on the surface. The fin 327 has a notch 329 on the edge and is to be inserted in the slots 323. Once all of the fins are inserted and soldered on the fin base 321, a heat pipe is then placed in the recess 325 on back side of the fin base 321. A cover which is not shown in the figure will be placed on the heat pipe to secure it on the fin base 321. Alternatively, the cover and heat pipe can be soldered on the recess 325 directly.

Figure 5:
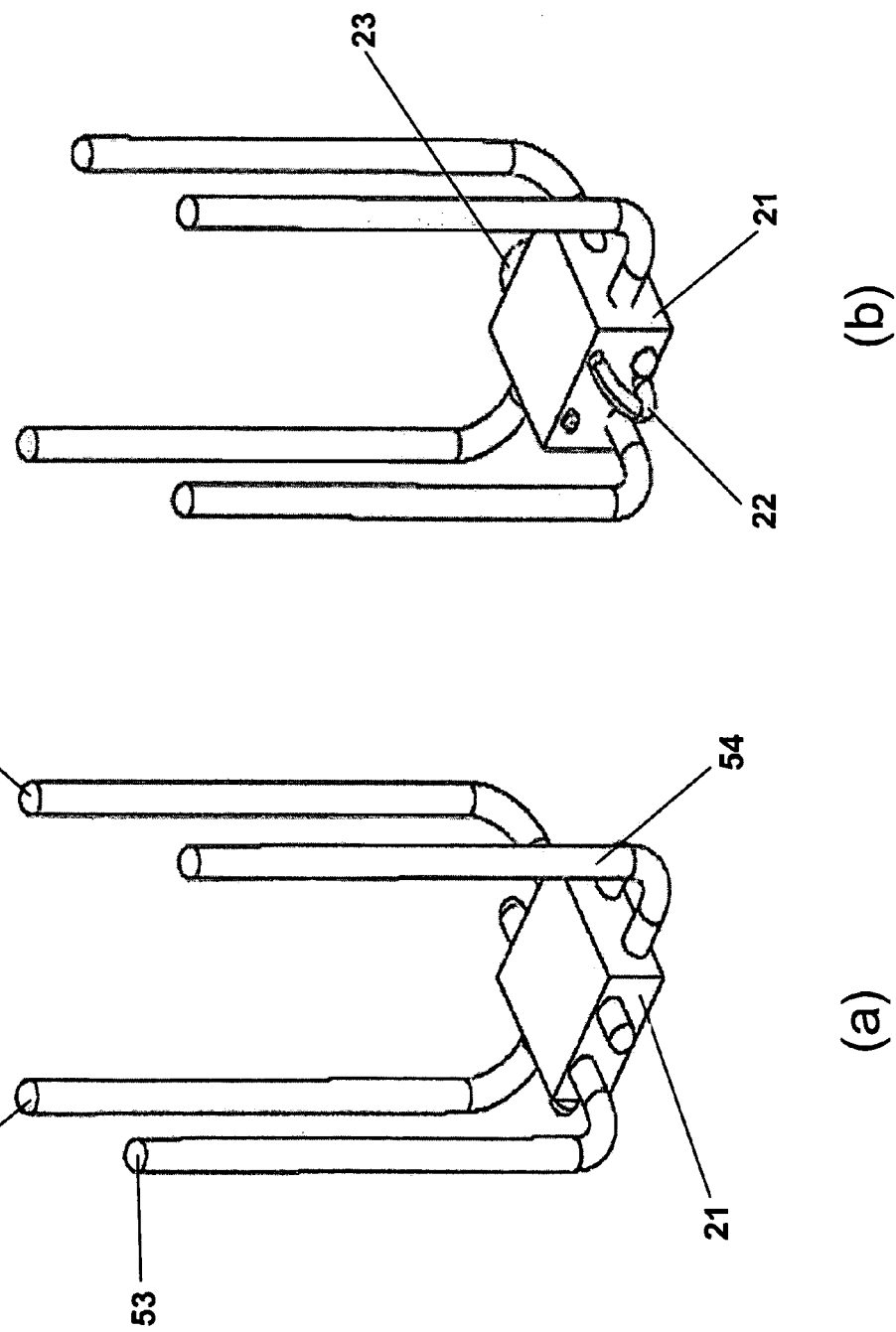
FIG. 5 The heat distribution block and heat pipe assemblies.
Figure 6:
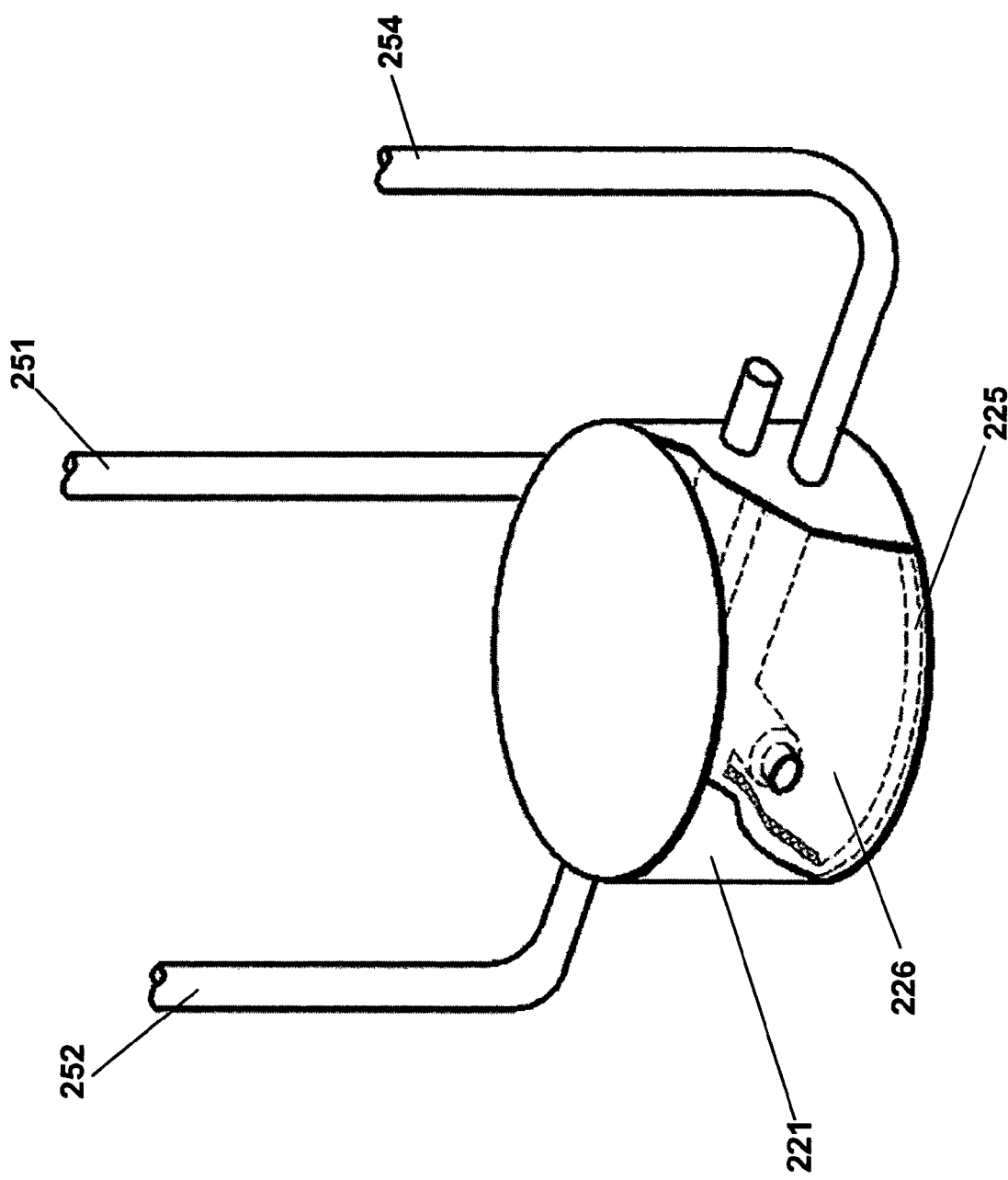
FIG. 6 The vapor chamber with multiple heat pipes inserted therein.

FIG. 5 shows the heat distribution block with multiple heat pipes inserted in. Referring to FIG. 5*a*, one end of the four heat pipes 51, 52, 53, and 54 are inserted and soldered in the heat distribution block 21. The four heat pipes 51, 52, 53, and 54 can be bent up as shown in the figure or into different configurations to accommodate the fin sets which are brought into a good thermal contact with the other end of these four heat pipes. FIG. 5*b* shows another heat distribution block arrangement, in which a couple of smaller heat pipes 22 and 23 are embedded in the block. These smaller heat pipes are bent into "U" shape such that both ends of the heat pipes are soldered into the block. The purpose of this arrangement is to reduce the temperature gradient within the heat distribution block 21. As shown in the figure, one end of the "U" shape heat pipe 22 is placed near the bottom of the heat distribution block 21 and the other end near the top surface. This heat pipe will help to transfer part of the heat coming from the bottom to the top of the block and, therefore, reducing the vertical temperature gradient within the block. FIG. 6 shows another structure of the heat distribution block 221 which is a vapor chamber with one end of the heat pipes inserted inside the vapor chamber. As shown in FIG. 6, The heat pipes 251, 252, and 254 are inserted inside the vapor chamber 226. For the clarity of the drawing, the forth heat pipe is not shown in the figure. As a matter of fact, the number of heat pipes can be any and should not be limited to four. There is a layer of wicks covering the inner surface of the vapor chamber 226 including the outer surface on the section of the heat pipes inside the chamber.

The wicks can be made of copper foams, sintered copper, or fiber bundles from heat conducting materials such as copper and graphite. The vapor chamber 226 is a vacuum sealed environment which is partially filled with a working fluid such as water, ethanol, florinert, acetone, etc. When heat is supplied to the bottom of the block 221 from a semiconductor chip, the working fluid absorbs the heat and vaporize. The vapor is then flowing across the chamber and to be condensed on the surface of the wicks and heat pipes. Heat is released to the wicks and heat pipes when the vapor becomes fluids again. The capillary force of the fluid will pull the fluid back to the heating side of the chamber. This cycle continues as long as there is temperature difference between the hot side of the chamber and the surface of the heat pipes.

Figure 7:
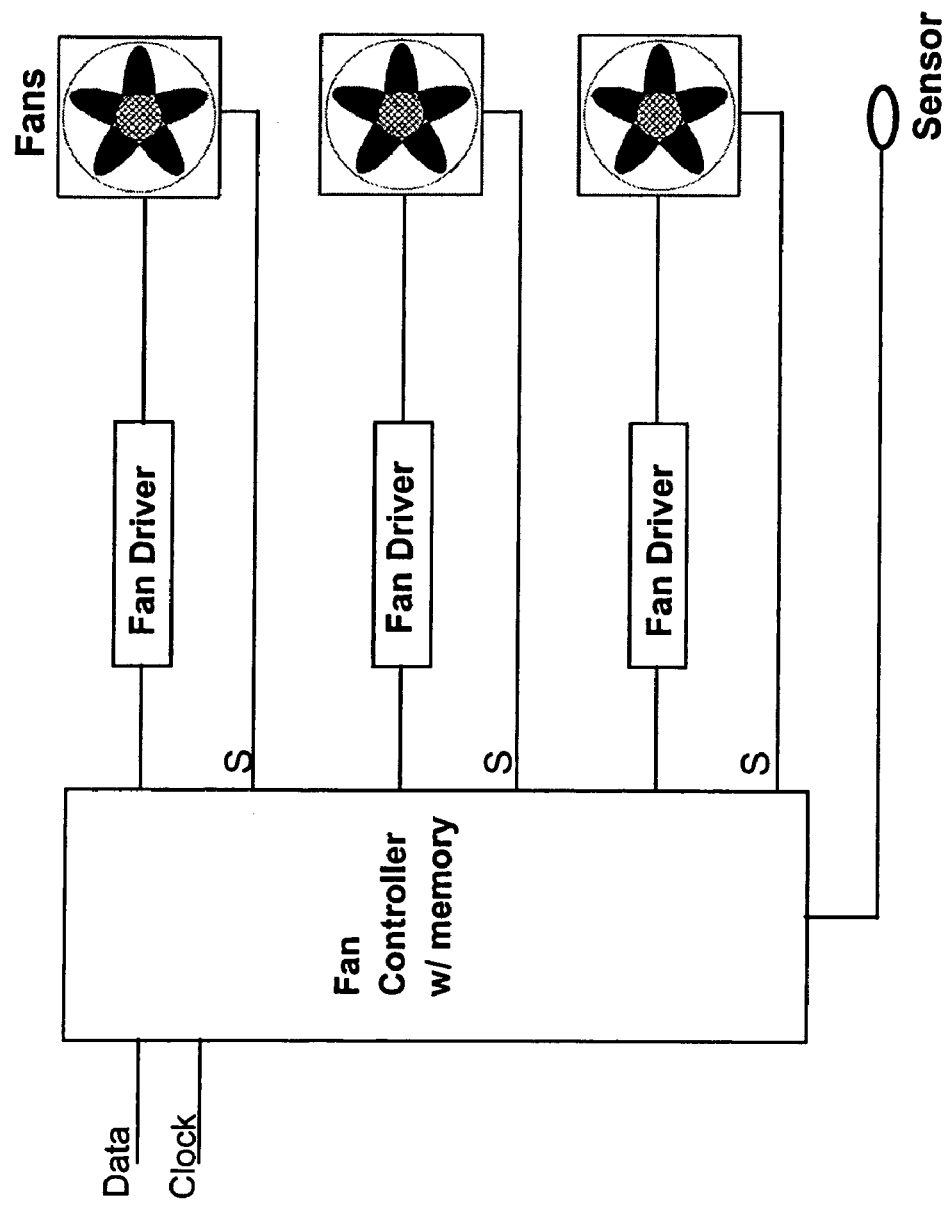
FIG. 7 The exemplary block diagram for controlling the multiple fans.

FIG. 7 shows an exemplary block diagram for controlling the fans. The fan controller which has processing units and memory attached or built in, takes the control data and commends from a system host and drives the fans at a predetermined speed through the fan drivers. The rotating speed of each fan will be fed back to the fan controller. If the fan speed is deviated away from the predetermined value, the fan controller will try to adjust it through the pulse width modulation (PWM) which is common in the art of fan speed controlling. If the speed of one fan cannot be recovered by this adjustment, the controller will mark this fan and try to increase the speed of the other fans. The percentage of the fan speed increase is based on a pre-stored table of fan heatsink cooling performance in the fan controller by interpolation. The goal is to maintain the same cooling performance when all fans are running at the predetermined speed. For the purposes of clarity, only major components are drawn in these figures and they are not drawn to scale.

The invention claimed is:

1. A fan-heatsink assembly comprising:
   multiple fans;
   multiple heat sinks;
   multiple heat pipes;
   a heat distribution block;
   a plurality of sets of said multiple fans and said multiple heatsinks; and
   said sets comprise heat sink fins substantially surrounding said fan so that said fan is substantially at the center of said fins.

2. The fan-heatsink assembly of claim 1 wherein said fans are centrifugal fans that pull in air at the inlet around the fan motor shaft from top and bottom.

3. The fan-heatsink assembly of claim 1 wherein said heat sink fins of are substantially oriented perpendicular to the fan motor shaft and arranged in-line or staggered.

4. The fan-heatsink assembly of claim 1 wherein said heat sink fins comprise a plurality of segments or one continuous cycle.

5. The fan-heatsink assembly of claim 1 wherein said heat sink fins of are made of thermally conductive materials.

6. The fan-heatsink assembly of claim 1 wherein said sets are brought into thermal contact with one end of the multiple heat pipes in series.

7. The fan-heatsink assembly of claim 1 wherein said heat sink fins of are soldered or brazed on one end of the said heat pipes.

8. The fan-heatsink assembly of claim 1 wherein said end of the multiple heat pipes are inserted into the said heat distribution block.

9. The fan-heatsink assembly of claim 1 wherein said heat distribution block comprises thermally conductive materials selected from the group consisting of copper, aluminum, and diamond.

10. The fan-heatsink assembly of claim 1 wherein said heat distribution block comprises heat pipes which are bent into "U" shape, embedded therein.

11. The fan-heatsink assembly of claim 1 wherein said sets are placed and stacked up on top of said heat distribution block or placed on the side of the said heat distribution block.

12. The fan-heatsink assembly of claim 1 further comprising a vapor chamber.

13. The fan-heatsink assembly of claim 11 wherein said vapor chamber comprising one end of the said heat pipes inserted therein and wicks covering a portion of the inner surface.

14. The fan-heatsink assembly according to claim 11 wherein the portion of the said heat pipes inside the vapor chamber comprises wicks covered on the outer surface.

15. The fan-heatsink assembly of claim 14 wherein said wicks comprise a material selected from the group consisting of sintered copper, copper fibers, copper meshes, copper foams, and graphite foams.

16. The fan-heatsink assembly of claim 12 wherein said vapor chamber is filled partially with fluids.

17. The fan-heatsink assembly of claim 16 wherein said vapor chamber is made of thermally conductive materials which are compatible to said fluids.

18. A fan-heatsink assembly comprising:
multiple fans;
multiple heat sinks;
multiple heat pipes;
a heat distribution block;
a plurality of sets of said multiple fans and said multiple heatsinks;
a vapor chamber;
said sets are placed and stacked up on top of said heat distribution system block or placed on the side of said heat distribution block;
said heat pipes comprise a portion thereof in said vapor chamber; and
said portion comprises wicks on an outer surface of said portion.

* * * * *